(12) United States Patent
Inagaki

(10) Patent No.: US 7,755,907 B2
(45) Date of Patent: Jul. 13, 2010

(54) ELECTRONIC CONTROL DEVICE

(75) Inventor: Tatsuya Inagaki, Kariya (JP)

(73) Assignee: Jtekt Corporation, Osaka-shi (JP)

( * ) Notice: Subject to any disclaimer, the term of this patent is extended or adjusted under 35 U.S.C. 154(b) by 743 days.

(21) Appl. No.: 11/674,332

(22) Filed: Feb. 13, 2007

(65) Prior Publication Data
US 2007/0230143 A1    Oct. 4, 2007

(30) Foreign Application Priority Data
Mar. 31, 2006   (JP)   ............... 2006-098610

(51) Int. Cl.
*H05K 5/06* (2006.01)
(52) U.S. Cl. .................. 361/752; 361/730; 174/520; 174/50.5; 439/76.2
(58) Field of Classification Search .............. 361/752, 361/730; 174/750; 439/76.1
See application file for complete search history.

(56) References Cited

U.S. PATENT DOCUMENTS

| 5,548,481 | A | 8/1996 | Salisbury et al. |
| 6,600,653 | B2 * | 7/2003 | Koike et al. ............. 361/704 |
| 7,120,024 | B2 * | 10/2006 | Watanabe et al. ........ 361/704 |
| 7,413,445 | B2 * | 8/2008 | Inagaki et al. ............ 439/76.1 |
| 2002/0154486 | A1 | 10/2002 | Koike et al. |
| 2003/0147204 | A1 * | 8/2003 | Koike et al. ............. 361/600 |
| 2003/0147217 | A1 * | 8/2003 | Koike et al. ............. 361/715 |
| 2005/0190539 | A1 | 9/2005 | Watanabe et al. |

FOREIGN PATENT DOCUMENTS

| DE | 94 03 685.3 | 5/1994 |
| DE | 43 24 913 C1 | 11/1994 |
| DE | 44 05 408 C1 | 5/1995 |
| EP | 1 509 074 A2 | 2/2005 |
| JP | 94 03 685.3 | 5/1994 |
| JP | 2005-150633 | 6/2005 |

* cited by examiner

*Primary Examiner*—Demeon E Levi
(74) *Attorney, Agent, or Firm*—Oblon, Spivak, McClelland, Maier & Neustadt, L.L.P.

(57) ABSTRACT

An upper lid and a bottom lid are fastened to flange portions formed in outer side surfaces of a casing main body. A metal collar to which a screw serving as pressing means (a fastening member) is inserted is embedded in each flange portion. Both end portions of each of the metal collars protrude at a predetermined length toward the upper lid and the bottom lid from the flange portion. A predetermined interval corresponding to the length of the protruding portion of the metal collar is created between the casing main body and the upper lid and between the casing main body and the bottom lid, by bringing the upper lid and the bottom lid into contact with the protruding portions of each of the metal collars at a time of assembling.

10 Claims, 3 Drawing Sheets

ELECTRONIC CONTROL DEVICE

BACKGROUND OF THE INVENTION

The present invention relates to an electronic control device.

For example, various types of waterproofing are applied to a casing accommodating an electronic circuit substrate, such as an electronic control device disclosed in Japanese Laid-Open Patent Publication No. 2005-150633. Conventionally, there has been required to effectively utilize a restricted space in a vehicle. Further, a high water resistance is required in the electronic control device for adding to flexibility in the arrangement.

This type of electronic control device is typically arranged in a portion close to a wheel in an engine compartment. Hence, when the vehicle is traveling on a riverbed or a beach, electronic control devices in the engine compartment can get wet with a great amount of water. In such a case, only the conventional waterproofing cannot necessarily provide a sufficient protection. Accordingly, in the electronic control device used under the environment mentioned above, an airtightness in a joint portion between the casing and a lid closing an opening of the casing is secured by using a sealing material (a silicone adhesive agent or the like) in place of a rubber sealing member such as an O-ring or the like.

In the case of the structure mentioned above, in order to stably obtain a high sealing performance, it is important to keep a clearance (an interval) between the casing and the lid constant at least until the sealing material is cured. However, in addition to the fact that a high assembling precision is required, segmented control processes must be performed until the sealing agent is cured after the casing and the lid are assembled. Therefore, the manufacturing costs of the electronic control device employing the structure mentioned above are increased due to the difficulty of the assembling steps and the complicated control processes.

SUMMARY OF THE INVENTION

An object of the present invention is to provide an electronic control device which has a high airtightness and can be easily manufactured.

To achieve the foregoing and other objectives, one aspect of the present invention provides an electronic control device having an electronic circuit substrate. The device includes a casing main body, a lid member, a sealing member, defining means, and pressing means. The casing main body accommodates the electronic circuit substrate. The lid member closes an opening of the casing main body. The sealing material is provided between the casing main body and the lid member and seals a joint portion between the casing main body and the lid member in a liquid tight manner. The defining means is provided in one of the casing main body and the lid member, and brought into contact with the other of the casing main body and the lid member, thereby defining an interval between the casing main body and the lid member. The pressing means presses the casing main body and the lid member to each other at a contact position where the defining means contacts the casing main body and at a contact position where the defining means contacts the lid member.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A description will be given of an embodiment according to the present invention with reference to the accompanying drawings.

Figure 1:
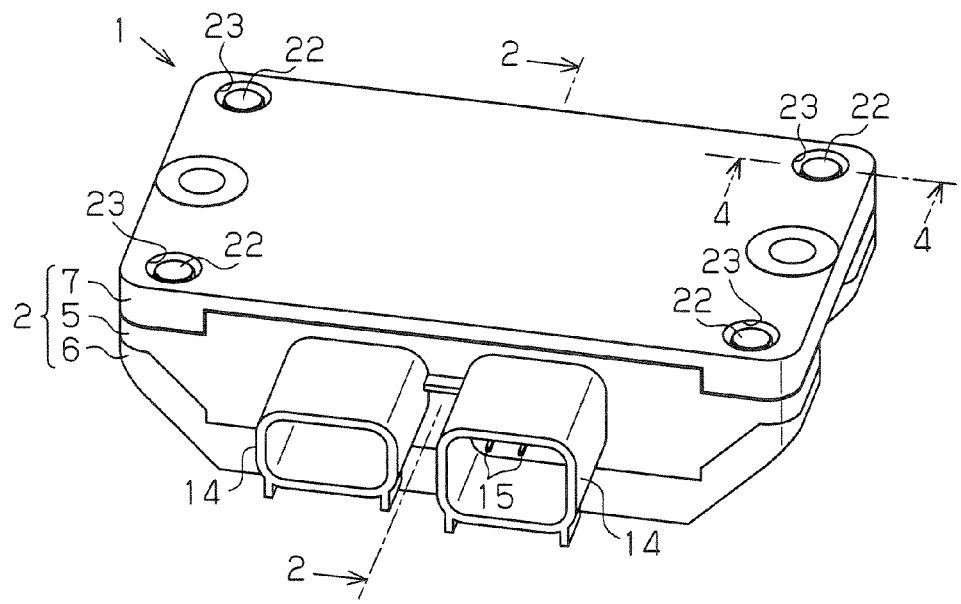
FIG. 1 is a perspective view of an electronic control device.
Figure 2:
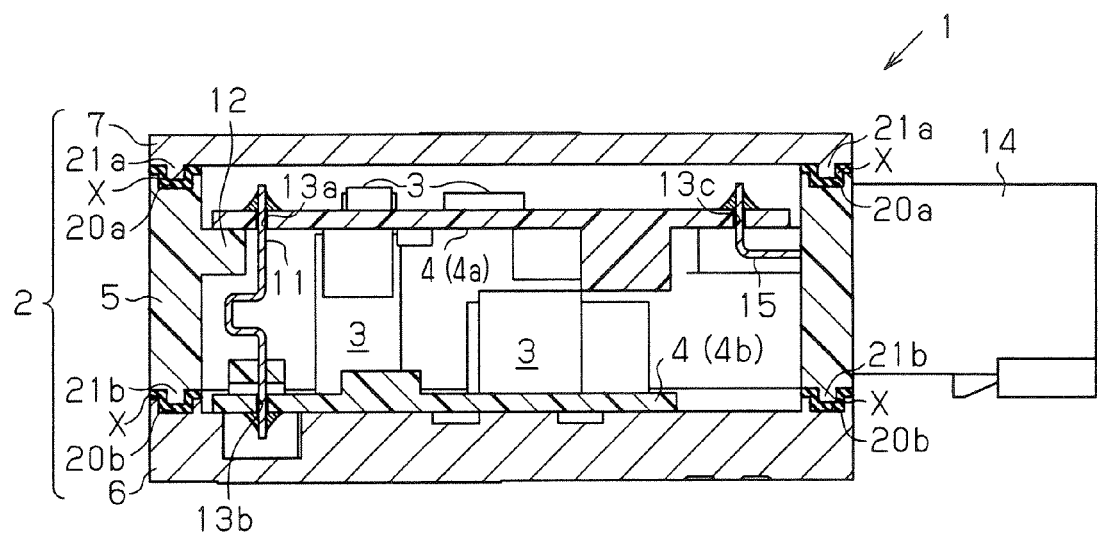
FIG. 2 is a cross sectional view taken along line 2-2 in FIG. 1.
Figure 3:
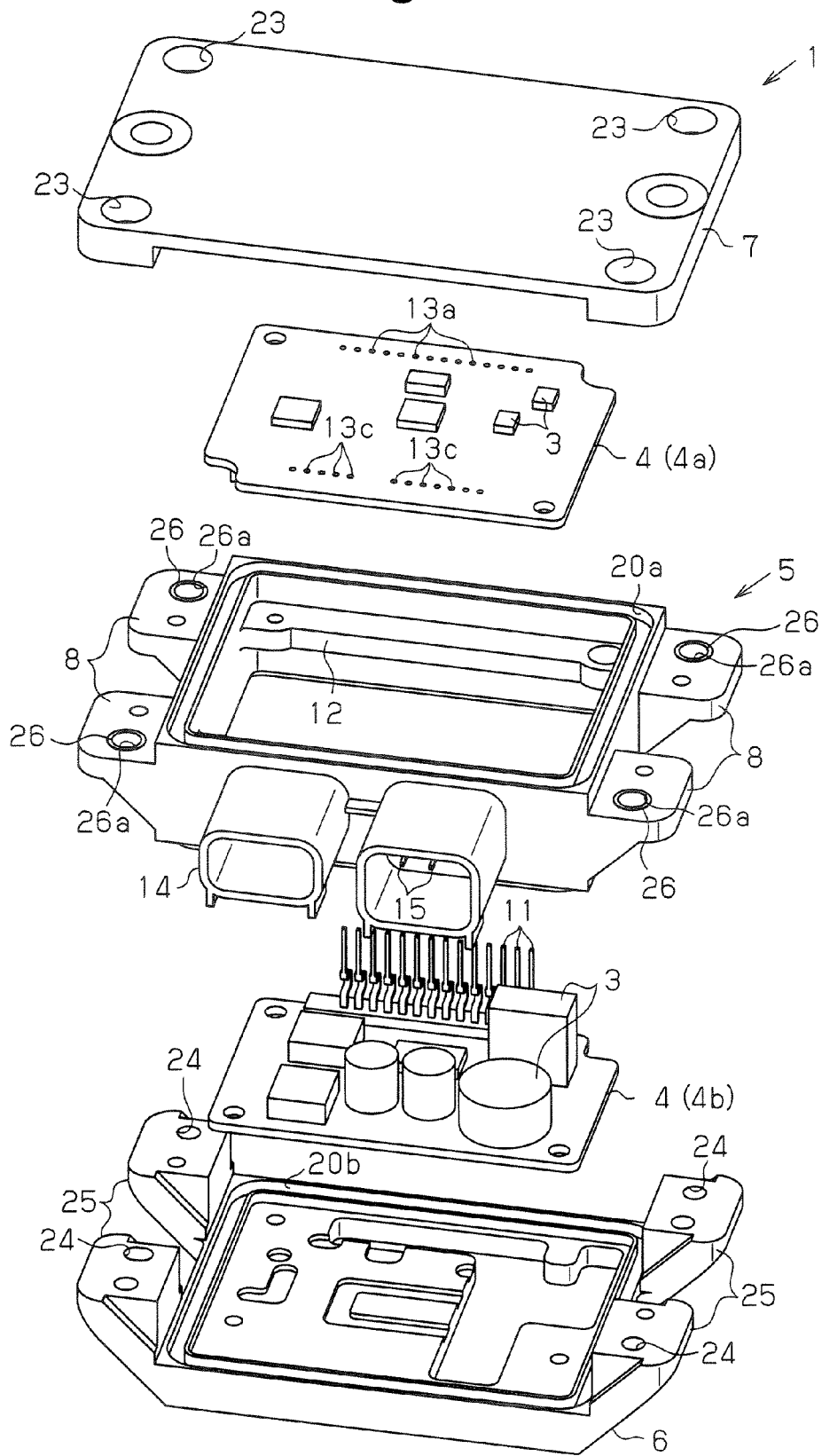
FIG. 3 is an exploded perspective view of the electronic control device.

As shown in FIGS. 1 to 3, an electronic control device 1 has a flat box-shaped casing 2. An electronic circuit substrate assembly 4 on which electronic components 3 are mounted is accommodated within the casing 2. The casing 2 is formed by a tubular casing main body 5, and substantially plate-shaped upper lid 6 and bottom lid 7 closing an opening of the casing main body 5. The upper lid 6 and the bottom lid 7 are fixed to flange portions 8 protruding laterally from outer side surfaces of the casing main body 5.

FIGS. 1 to 3 are shown in accordance with a layout in assembling steps, however, the layout at a time of being actually mounted to a vehicle is inverted to the layout in the assembling steps. Accordingly, in each of the drawings, the upper lid 6 directed upward at a time of being mounted to the vehicle is shown in a lower side, and the bottom lid 7 directed downward is shown in an upper side.

Further, a pair of flange portions 8 are respectively provided in each of two facing side surfaces of the casing main body 5. In other words, the casing main body 5 has four flange portions 8, and the respective flange portions 8 are provided near corners of the casing main body 5. A fastening force applied to the upper lid 6 and the bottom lid 7 is substantially uniformly dispersed, on the basis of this layout.

The electronic circuit substrate assembly 4 has a two-layer structure. The electronic circuit substrate assembly 4 is provided with two substrates 4a and 4b, and both the substrates 4a and 4b are electrically connected by a plurality of connection terminals 11. A plate-shaped support portion 12 is formed in an inner wall of the casing main body 5. The respective substrates 4a and 4b are fixed to the casing main body 5 via the support portion 12, thereby being arranged substantially in parallel to the bottom lid 7 and the upper lid 6. Further, both the substrates 4a and 4b can be electrically connected to each other via a plurality of connection terminals 11 by inserting and soldering both ends of the connection terminals 11 into component holes 13a and 13b of the respective substrates 4a and 4b. FIG. 3 shows a state in which one end of each connection terminal 11 is inserted to the corresponding component hole 13b of the substrate 4b.

Substantially tubular connector portions 14 protruding laterally are provided in an outer side surface of the casing main body 5. A wire harness (not shown) is coupled to each connector portion 14. A plurality of connector terminals 15 are provided within each connector portion 14. Each of the connector terminals 15 passes through a side wall of the casing main body 5. One end of each of the connector terminals 15 extending into the casing 2 is inserted and soldered to one of component holes 13c of the substrate 4a. Accordingly, each of the connector terminals 15 is electrically connected to the electronic circuit substrate assembly 4.

(Sealing Structure)

Next, a description will be given of a seal structure of the electronic control device 1.

As shown in FIGS. 1 to 4, a seal groove 20a is formed in an open end of the casing main body 5 to which the bottom lid 7 is attached, over an entire periphery of the opening. Further, a protruding portion 21a is formed at a position corresponding to the seal groove 20a of the casing main body 5 in an inner wall surface of the bottom lid 7. On the other hand, a seal groove 20b similar to the seal groove 20a is formed on an inner wall surface of the upper lid 6. Further, a protruding portion 21b is formed at a position corresponding to the seal groove 20b of the upper lid 6, in an open end of the casing main body 5 to which the upper lid 6 is attached. Each of the seal grooves 20a and 20b and the protruding portions 21a and 21b is formed in a continuous loop. When the upper lid 6 and the bottom lid 7 are assembled in the casing main body 5, the respective protruding portions 21a and 21b are arranged within the corresponding seal grooves 20a and 20b. Further, joint portions between the casing main body 5, and the upper lid 6 and the bottom lid 7 are sealed by a sealing material X filling each of the seal grooves 20a and 20b. In the present embodiment, a silicone adhesive agent is employed for the sealing material X.

In assembling steps of the electronic control device 1, the casing main body 5 is arranged on the upper lid 6 in a state in which the protruding portion 21b thereof is directed downward, after filling the seal groove 20b of the upper lid 6 with the sealing material X, as shown in FIG. 3. Subsequently, the bottom lid 7 is arranged on the casing main body 5 after filling the seal groove 20a of the casing main body 5 with the sealing material X. Further, the upper lid 6 and the bottom lid 7 are fastened to each of the flange portions 8 by screws 22 serving as pressing means (fastening members).

The bottom lid 7 has four insertion holes 23 to which screws 22 are inserted. The insertion holes 23 are provided at positions corresponding to the flange portions 8 in the bottom lid 7. The upper lid 6 has four threaded holes 24 with which the screws 22 are engaged. The threaded holes 24 are formed at positions (four positions) corresponding to the respective insertion holes 23 in the upper lid 6. Further, the upper lid 6 has thick portions 25 at positions (four positions) corresponding to the respective flange portions 8. Each of the threaded holes 24 is formed in each of the thick portions 25. Further, an installation hole 26a for installing a metal collar 26 is formed at a position corresponding to each of the insertion holes 23 and each of the threaded holes 24. In other words, each metal collar 26 is embedded in one of the flange portions 8 via the installation hole 26a. The screws 22 inserted from the insertion holes 23 of the bottom lid 7 are fastened to the threaded holes 24 via the metal collars 26 embedded in the flange portions 8. Accordingly, the upper lid 6 and the bottom lid 7 are attached to the casing main body 5 in such a manner as to pinch each of the flange portions 8.

Figure 4:
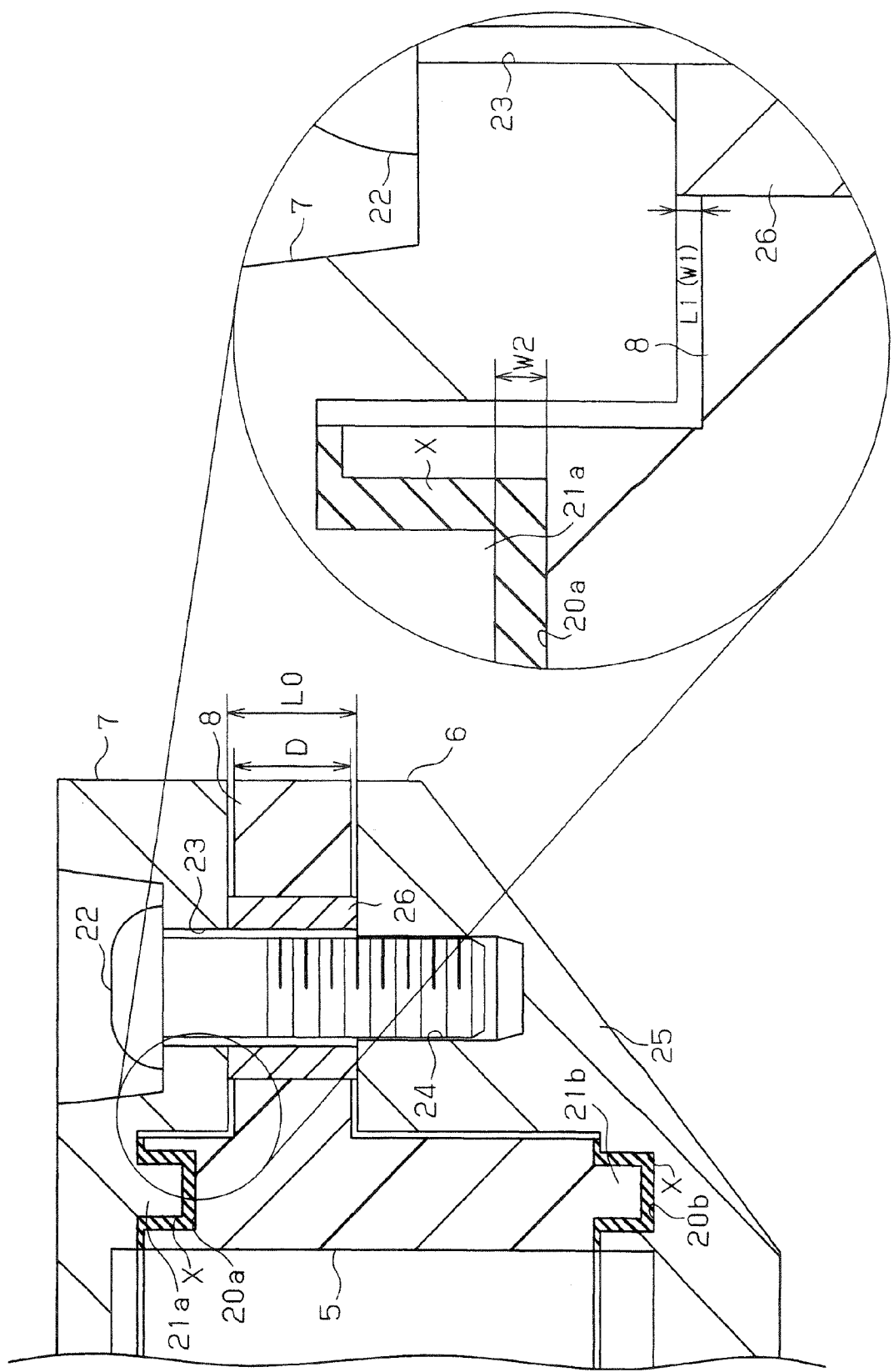
FIG. 4 is a cross-sectional view taken along line 4-4 in FIG. 1.

As shown in FIG. 4, an axial length L0 of each of the metal collars 26 is set slightly larger than a thickness D of the flange portions 8. Accordingly, both end portions of the metal collar 26 protrude at a predetermined length L1 from the flange portion 8. Further, the protruding portion of each of the metal collars 26 is brought into contact with the upper lid 6 and the bottom lid 7 at a time of fastening the upper lid 6 and the bottom lid 7 to the casing main body 5, whereby an interval W1 corresponding to the length L1 of the protruding portion of the metal collar 26 is created between the casing main body 5, and the upper lid 6 and the bottom lid 7, and a predetermined interval W2 is created between the protruding portions 21a and 21b and bottom surfaces of the seal grooves 20a and 20b.

As mentioned above, in accordance with the present embodiment, it is possible to obtain the following operations and advantages.

(1) The upper lid 6 and the bottom lid 7 are fixed to the flange portions 8 formed in the outer side surfaces of the casing main body 5. The metal collars 26 to which the screws 22 are inserted are embedded in the flange portions 8. Further, both end portions of each of the metal collars 26 protrude at the predetermined length L1 toward the upper lid 6 and the bottom lid 7 from the flange portion 8. Further, the protruding portion of each of the metal collars 26 is brought into contact with the upper lid 6 and the bottom lid 7 at a time of assembly, whereby the interval W1 corresponding to the length L1 of the protruding portion of the metal collar 26 is created between the casing main body 5 and the upper lid 6 and between the casing main body 5 and the bottom lid 7.

In accordance with the structure mentioned above, the protruding portions of each metal collar 26 is brought into contact with the upper lid 6 and the bottom lid 7, whereby the predetermined interval W1 is created between the casing main body 5 and the upper lid 6 and between the casing main body 5 and the bottom lid 7 at a time of assembly. In this case, the interval W1 mentioned above can be maintained only by pressing the upper lid 6 and the bottom lid 7 to the casing main body 5 without requiring any special managing work after assembling. In other words, the metal collar 26 corresponds to defining means for defining the interval W1. Further, the upper lid 6 and the bottom lid 7 are brought into contact with the metal collars 26 at the predetermined positions, whereby it is possible to avoid a deflection of the upper lid 6 and the bottom lid 7 caused by the pressing force of the screws 22. Accordingly, dispersion is not generated in the intervals between the casing main body 5 and the upper lid 6 and between the casing main body 5 and the bottom lid 7, and it is possible to make the thickness of the sealing material X uniform. As a result, it is possible to easily and stably secure a high airtightness between the casing main body 5 and the upper lid 6 and between the casing main body 5 and the bottom lid 7.

(2) The casing main body 5 is provided with a plurality of flange portions 8. The flange portions 8 are arranged in such a manner that the fastening force applied to the upper lid 6 and the bottom lid 7 is dispersed substantially uniformly.

In accordance with the structure mentioned above, it is possible to prevent the fastening force applied to the upper lid 6 and the bottom lid 7 from being biased, and it is possible to assemble the upper lid 6 and the bottom lid 7 in parallel to the casing main body 5. Accordingly, it is possible to make the uniform interval between the upper lid 6 and the casing main body 5, and between the bottom lid 7 and the casing main body 5 over the whole of the joint portion between the upper lid 6 and the casing main body 5, and between the bottom lid 7 and the casing main body 5, and it is possible to make the thickness of the sealing material X being uniformed.

(3) The seal groove 20a and 20b are respectively formed in the open end of the casing main body 5 to which the bottom lid 7 is attached, and the inner wall surface of the upper lid 6. Further, the protruding portions 21b and 21a are respectively formed in the open end of the casing main body 5 to which the upper lid 6 is attached, and the inner wall surface of the bottom lid 7.

In accordance with the structure mentioned above, an adhesion area of the sealing material X is increased, and the airtightness between the casing main body 5 and the upper lid 6, and between the casing main body 5 and the bottom lid 7 is improved. Further, in the assembling steps, the casing main body 5 is arranged on the upper lid 6 in a state in which the protruding portion 21b thereof is directed downward, after filling the seal groove 20b of the upper lid 6 with the sealing material X. Subsequently, the bottom lid 7 is arranged on the casing main body 5, after filling the seal groove 20a of the casing main body 5 with the sealing material X. These simple steps create the predetermined interval W1 between the casing main body 5 and the upper lid 6, and between the casing main body 5 and the bottom lid 7, and the predetermined interval W2 between the protruding portions 21a and 21b and the bottom surfaces of the seal grooves 20a and 20b. Further, it is possible to fill, with the sealing material X, a space between the casing main body 5 and the upper lid 6, a space between the casing main body 5 and the bottom lid 7, and a space between the protruding portions 21a and 21b and the bottom surfaces of the seal grooves 20a and 20b, without creating any gap. Accordingly, it is possible to secure a high sealing performance between the casing main body 5 and the upper lid 6, and between the casing main body 5 and the bottom lid 7 on the basis of the simple assembling work. Further, it is possible to move and store an assembled body without waiting for hardening of the sealing material X after being assembled. Therefore, it is possible to achieve a wide improvement of a manufacturing efficiency on the basis of automation.

The present embodiment may be modified as follows.

In the present embodiment, the casing 2 is formed by the flat tubular casing main body 5, and the substantially plate-shaped upper lid 6 and bottom lid 7 closing the opening of the casing main body 5. Further, the upper lid 6 and the bottom lid 7 serving as the lid member are fixed to the flange portions 8 formed in the outer side surface of the casing main body 5. However, it is possible to change the shape of the casing main body 5, the number of the openings of the casing main body 5, and the structure of the lid member closing the opening.

In the illustrated embodiment, both ends of each of the metal collars 26 embedded in the flange portions 8 protrude at the predetermined length L1 from the flange portions 8. In place of the metal collars 26 used as defining means, for example, a similar shape to the metal collar 26 may be provided in each flange portion 8, or defining means may be provided in the upper lid 6 and the bottom lid 7.

In the illustrated embodiment, the screws 22 fastening the upper lid 6 and the bottom lid 7 to the casing main body 5 serve as pressing means. However, it is possible to employ an optional member which can press the upper lid 6 and the bottom lid 7 to the casing main body 5 at contact positions between the upper lid 6 and the defining means, and between the bottom lid 7 and the defining means, at least until the sealing material X is cured.

In the illustrated embodiment, four flange portions 8 are provided near the corners of the casing main body 5, in each of two facing side surfaces of the casing main body 5. However, the number and the positions of the flange portions 8 may be changed as far as the fastening force applied to the upper lid 6 and the bottom lid 7 is dispersed substantially uniformly. Generally, it is possible to substantially uniformly disperse the fastening force mentioned above, by arranging a plurality of flanges in a point symmetrical manner.

In the present embodiment, the seal grooves 20a and 20b are formed in the open end of the casing main body 5 to which the bottom lid 7 is attached, and the inner wall surface of the upper lid 6. Further, the protruding portions 21a and 21b are formed in the open end of the casing main body 5 to which the upper lid 6 is attached, and the inner wall surface of the bottom lid 7. However, the positional relation between the seal grooves 20a and 20b and the protruding portions 21b and 21a may be inverted between the casing main body 5 and the upper lid 6, and between the casing main body 5 and the bottom lid 7.

The invention claimed is:

1. An electronic control device having an electronic circuit substrate, the device comprising:
    a casing main body accommodating said electronic circuit substrate;
    a lid member closing an opening of said casing main body;
    a sealing material provided between said casing main body and said lid member and sealing a joint portion between said casing main body and said lid member in a liquid tight manner;
    defining means provided in one of said casing main body and said lid member, and brought into contact with the other of said casing main body and said lid member, thereby defining an interval between said casing main body and said lid member; and
    pressing means pressing said casing main body and said lid member to each other at a contact position where the defining means contacts the casing main body and at a contact position where the defining means contacts said lid member,
    wherein said casing main body is formed in a tubular shape, said lid member includes an upper lid and a bottom lid closing openings of said casing main body, a flange portion is provided in an outer side surface of said casing main body and protrudes laterally, wherein said upper lid and said bottom lid are fixed to said casing main body by said pressing means in such a manner as to hold said flange portion, and wherein said defining means is provided in portions of said flange portion that face said upper lid and said bottom lid.

2. The electronic control device according to claim 1, wherein the flange portion is one of a plurality of flange portions, and wherein said flange portions are arranged in such a manner that a pressing force of said pressing means is uniformly applied to said upper lid and said bottom lid.

3. The electronic control device according to claim 2, wherein each of said flange portions is provided near a corner of said casing main body.

4. The electronic control device according to claim 1, further comprising:
    a groove provided in one of said casing main body and said lid member, the groove being filled with said sealing material; and
    a protruding portion provided in the other of said casing main body and said lid member and arranged within said groove.

5. The electronic control device according to claim 1, further comprising:
    grooves provided in one of both opening ends of said casing main body, and in one of said upper lid and said bottom lid, the grooves being filled with said sealing material;
    a protruding portion provided in the other of said both opening ends and arranged within the groove of said upper lid or the bottom lid; and a protruding portion provided in the other of said upper lid and the bottom lid and arranged within the corresponding groove of said casing main body.

6. The electronic control device according to claim 5, wherein said grooves are provided in said upper lid, and in the open end of said casing main body facing said bottom lid, and wherein said protruding portions are provided in said bottom lid, and in the open end of said casing main body facing said upper lid.

7. The electronic control device according to claim 1, wherein said pressing means is a fastening member for fastening said upper lid and bottom lid to said flange portion.

8. The electronic control device according to claim 7, wherein said defining means includes a metal collar to which said fastening member is inserted, and wherein said metal collar is embedded in said flange portion in a state in which an end portion thereof is protruded from said flange portion.

9. The electronic control device according to claim 8, whereby the interval between said casing main body and said lid member defined by said defining means is a height interval, wherein the lid member has a thickened portion having a greater thickness in the height direction at a position corresponding to the flange portion and the fastening member inserted in the metal collar engages the lid member at said thickened portion to fasten said lid member to said casing main body, wherein a thickness of the flange portion in the height direction and the length of the metal collar in the height direction are less than the height of the casing main body.

10. The electronic control device according to claim 9, further comprising:
   a groove provided in one of said casing main body and said lid member, the groove being filled with said sealing material; and
   a protruding portion provided in the other of said casing main body and said lid member and arranged within said groove.

* * * * *